United States Patent [19]

Thorpe

[11] Patent Number: 6,060,666
[45] Date of Patent: May 9, 2000

[54] ELECTROLYTIC LAYER APPLIED TO METALLIC FOIL TO PROMOTE ADHESION TO A POLYMERIC SUBSTRATE

[75] Inventor: John E. Thorpe, Palos Verdes Estates, Calif.

[73] Assignee: Foil Technology Development Corporation, Burlington, N.J.

[21] Appl. No.: 08/996,091

[22] Filed: Dec. 22, 1997

[51] Int. Cl.$^7$ ............................... H05K 1/03; B21C 37/00
[52] U.S. Cl. ......................... 174/255; 174/258; 428/607; 428/612; 428/675; 428/678
[58] Field of Search ............................ 252/512; 174/256, 174/258, 255; 428/607, 612, 626, 675, 678

[56] References Cited

U.S. PATENT DOCUMENTS

| | | |
|---|---|---|
| 3,293,109 | 12/1966 | Luce et al. . |
| 3,328,275 | 6/1967 | Waterbury . |
| 3,857,681 | 12/1974 | Yates et al. . |
| 3,918,926 | 11/1975 | Wolski et al. . |
| 4,935,310 | 6/1990 | Nakatsugawa ........................... 428/607 |
| 5,366,814 | 11/1994 | Yamanishi et al. ..................... 428/607 |
| 5,709,957 | 1/1998 | Chiang et al. .......................... 428/615 |

*Primary Examiner*—Mark Kopec
*Assistant Examiner*—Derrick G. Hamlin
*Attorney, Agent, or Firm*—Finnegan, Henderson, Farabow, Garrett & Dunner, L.L.P.

[57] ABSTRACT

A metallic foil, and a process for producing the same, having a metallic micro-layer electrodeposited on a surface of the foil, wherein the micro-layer comprises two co-deposited metals each being a metal other than the metal forming the foil, and does not change the topography of the surface on which it is deposited. The foil may be formed of copper, and the micro-layer may be formed of iron and nickel. When bonded to a polymeric substrate the peel strength of the foil is improved.

5 Claims, No Drawings

ELECTROLYTIC LAYER APPLIED TO METALLIC FOIL TO PROMOTE ADHESION TO A POLYMERIC SUBSTRATE

FIELD OF THE INVENTION

This invention relates to the electrolytic treatment of metallic foil in order to promote adhesion between the foil and dielectric base materials and particularly to copper-clad laminates for use in the manufacture of printed circuit boards.

BACKGROUND OF THE INVENTION

Metallic foils and particularly copper foil are used in the production of printed circuit boards. Such foils are bonded by heat and pressure to dielectric base materials, e.g. in accordance with the teachings of U.S. Pat. No. 3,328,275. The most common base material is epoxy impregnated glass fabric. In order to obtain a useful level of adherence between the copper foil and the epoxy various so-called treatments have been developed which provide the copper with a roughened surface into which the resin is forced during laminating. This roughened surface thereby provides a physical interlock between the two components. Typical treatments are described in U.S. Pat. Nos. 3,857,681, 3,293,109, and 3,918,926.

Such treatments provide a surface of the original foil with an electrodeposited metallic structure comprising copper, copper oxide, and zinc or brass. To control these sequentially deposited layers the use of grain refining agents has also been proposed, and the use of arsenic, tellurium, antimony, and other metals has been proposed as essential to the production of such treatment layers. It will be evident that the control of these layers is difficult because of their complexity and therefore adds significantly to the production cost of copper foil. It is furthermore the case that, in spite of the best efforts of the industry, variations still occur in the performance of the applied layers both in terms of copper particles residual in the base laminate after etching (called treatment transfer) and inconsistency of peel strength (the force required to strip the copper from the base material). However, more important than this is the fact that this complex metal layer, not being pure copper, interferes with the electric current carrying capability of the copper circuit tracks because a significant part of the track is of lower electrical conductivity than pure copper. Whilst these factors are manageable within the copper foil and PCB industry, increasing sophistication of circuit designs highlights the problem caused by the present technology. Therefore, a primary object of the present invention is an advantageous alternative method of promoting adhesion between metallic foils and the base material where adhesion does not rely on a substantial treatment layer of non-copper metal.

SUMMARY OF THE INVENTION

The above and other object of the invention may be achieved by a process wherein, metallic foil is electrochemically treated to improve its adhesion to typical resin-impregnated glass fabric base materials. The treatment preferably involves providing the foil with a thin metallic layer comprising metals selected to provide a bond at the molecular level between the metal and the resin used; the metallic layer does not substantially change the topography of the foil surface and the bond may be achieved without any reliance on a physical interlocking of the resin to the foil surface. The invention also relates to foil so treated and to a printed circuit board (PCB) produced from it.

The present invention is based on the idea of selecting a non-copper metallic layer where the molecular structure of the layer has an affinity with the molecular composition of the resin used in the base material, or polymeric substrate, such that, when the base material and the metallic foil are laminated by bringing them together under heat and pressure, a chemical bond is formed between the two materials. The above layer may be so thin that it is virtually undetectable on the surface of the foil, does not change the topography of the foil surface, and does not in any way rely on providing a physical interlock between the foil and the resin system used in the base material. The above metallic layer may be electrodeposited on either or both, the matte side or the shiny side of the foil.

According to the present invention it is possible to provide a metallic foil with an exceptionally thin layer of two or more metals of a character that will adhere to a surface of the metallic foil and bond chemically to the resin in selected base materials. The benefits of such a system are that it is simple to apply, is electrically insignificant as a presence on the foil, does not interfere with the surface of the foil laminate, and is virtually undetectable after the circuit is produced.

DESCRIPTION OF THE PREFERRED EMBODIMENTS OF THE INVENTION

In a preferred process, raw electrolytic copper foil, i.e., the foil as produced on a drum-cathode is subjected to a single step electrolytic process which results in a micro-layer of metallic alloy electrodeposited on a surface of the foil, preferably the matte surface, which layer is metallurgically integrated with the copper foil and which will prepare it for bonding to a typical epoxy impregnated glass fabric. Following this process the treated foil surface is brought in contact with the epoxy impregnated glass fabric under heat and pressure in a laminating press. After removal from the press the level of adhesion is measured, and in tests a peel strength of 12.2 lb/inch (21.4 N/cm) was found. This compares with a peel strength of 4.5 lb/inch (7.88 N/cm) on the same copper foil not subjected to the present treatment or other bond-enhancing treatment.

EXAMPLE

The matte side of copper foil weighing 150 g/m$^2$ (produced generally in accordance with the teaching of U.S. Pat. No. 2,944,954) was submitted to a single step electro-plating process as described below. The foil was held vertically in the electrolyte both and parallel to the anode.

Bath composition and plating conditions were as follows:

| | |
|---|---|
| $NiSO_4.7H_2O$ | 80 g/l |
| $FeSO_47H_2O$ | 50 g/l |
| Glycine | 50 g/l |
| pH | 2.0–2.2 |
| Temperature | Ambient |
| Anode Material | Stainless Steel |
| Anode/Cathode gap | 25 mm |
| Current Density | 50 A/ft$^2$ (5.4 A/dm$^2$) |
| Plating Time | 2–5 s |

In this electroplating bath the iron from the ferrous sulphate co-deposited with the nickel to give a fine dispersion of iron at the copper surface. This dispersion was believed to be regulated by the nickel and glycine so that it was evenly distributed over the copper crystals at the foil surface.

It was noted that within the preferred range of plating times the layer was so thin that its presence could not be detected by microscopic examination at typical industry magnifications, and it certainly did not change the topography of the surface onto which it was plated.

After processing, the foil in accordance with the present invention was examined at 5000× magnification in a scanning electron microscope and compared with a photograph taken at the same magnification of the same foil before processing. There was no visible change in the crystal structure of the foil, although to the eye the foil surface had changed color from copper to a very light grey. This absence of physical change would, on the basis of all the prior art, indicate that there should be no difference in the level of adhesion between the two pieces of copper foil, since there was no increased surface area into which the base material resin could be forced during laminating However, when both foil treated as above and untreated foil were laminated with the matte surfaces of each adhered to different areas of the same piece of preimpregnated glass fabric under typical heat and pressure conditions as used in the industry. i.e, 175° C. at 500 p.s.i.(3.45 MPa) and the adhesion was measured in accordance with the procedures laid down in US Military Specifications 1349 it was found that the difference in adhesion was as follows:

| Untreated Copper Foil | 4.5 lb/inch (7.85 N/cm) |
| Treated Copper Foil (Invention) | 12.2 lb/inch (21.4 N/cm). |

The adhesion of the treated foil substantially exceeded the standard requirement for copper clad laminates.

When this treated copper was chemically etched from the base laminate it was found that the laminate surface was extremely clean, smooth, and totally free of any particles originating from and typical of dendritic treatments as are commonly used in the industry.

In comparison with the prior art the present invention has the advantage of enabling one to replace a multi-stage electrolytic process with a single stage process of extremely short duration. Such a process permits the consideration of incorporating it in line with the production of the copper foil, thereby eliminating the highly expensive equipment and processes currently in use. Furthermore, because the adhesion apparently does not depend on a physical interlocking but presumably on a crosslinking between the resin molecules and the metal molecules of the treatment layer, the interface between the copper and the dielectric base is substantially free of non-copper impurities, leading to improved functioning of any circuit made on the material.

The example quoted is particularly applicable to bonding copper foil to glass reinforced epoxy, but other combinations of metals and dielectric materials can be selected to create similar intermolecular bonding.

The invention may thus provide 1) a metallic foil provided with a micro-layer of a metal selected to provide a molecular construction compatible with the molecular structure of the dielectric material to which the foil may subsequently be bonded;

2) a foil where the application of such a layer does not change the topography of the foil in any significant way;

3) a laminate comprising metallic foil, provided with such a layer, bonded to a dielectric base in such a way that the insulating component of the dielectric base combines with the metal in the micro-layer to form a bond of utility in the production of printed circuit boards.

Having described a preferred embodiment of the present invention, it is to be understood that modifications thereof falling within the spirit of the invention may become apparent to those skilled in the art, and the scope of the invention is to be determined by the appended claims and their equivalents.

What is claimed is:

1. A copper foil having a metallic micro-layer electrodeposited on a surface of the foil, wherein the micro-layer comprises co-deposited iron and nickel, and the micro-layer does not substantially change the topography of the surface on which it is deposited.

2. The copper foil of claim 1, wherein the foil is electrolytic copper having a shiny surface and a matte surface, and the micro-layer is deposited on the matte surface of the foil.

3. A metal-clad laminate comprising a polymeric substrate and the copper foil of claim 1, wherein the surface of the foil having the micro-layer deposited thereon is bonded to the substrate.

4. The laminate of claim 3, wherein the substrate is epoxy resin impregnated glass fabric.

5. The laminate of claim 4, wherein the foil has a shiny surface and a matte surface and the micro-layer is deposited on the matte surface.

* * * * *